United States Patent
Ishikura et al.

[11] Patent Number: 6,060,118
[45] Date of Patent: May 9, 2000

[54] CVD METHOD OF MANUFACTURING DIAMOND CRYSTAL

[75] Inventors: Takefumi Ishikura; Satoshi Yamashita; Shin-ichi Ojika, all of Tokyo; Hiroshi Kawarada, Kanagawa, all of Japan

[73] Assignees: Tokyo Gas Co., Ltd.; Tokyo Gas Chemicals Co., Ltd., both of Tokyo, Japan

[21] Appl. No.: 08/988,612

[22] Filed: Dec. 11, 1997

Related U.S. Application Data

[62] Division of application No. 08/410,218, Mar. 24, 1995, Pat. No. 5,792,556.

[30] Foreign Application Priority Data

Mar. 25, 1994 [JP] Japan .................................. 6-79975

[51] Int. Cl.$^7$ .............................. C23C 16/26; B05D 3/06
[52] U.S. Cl. .................... 427/249; 427/577; 427/122; 427/575; 427/580; 423/446; 117/929
[58] Field of Search .................. 427/577, 249, 427/589, 575, 122; 423/446; 117/929

[56] References Cited

U.S. PATENT DOCUMENTS

| | | | |
|---|---|---|---|
| 5,082,359 | 1/1992 | Kirkpatrick | 359/642 |
| 5,298,286 | 3/1994 | Yang et al. | 427/249 |
| 5,479,875 | 1/1996 | Tachibana et al. | 117/103 |
| 5,743,957 | 4/1998 | Kobashi | 117/929 |
| 5,755,879 | 5/1998 | Shintani et al. | 117/101 |

FOREIGN PATENT DOCUMENTS

89/11897  12/1989  WIPO .

OTHER PUBLICATIONS

Gas Flow Effects in Synthesis of Diamond By Hot–Filament Chemical Vapor Deposition, Singh, J. Vellaikal M., and Dat, R., Thin Solid Films, 238 (1994) pp. 133–140.

Heteroepitazally Grown Diamond on a c–BN (111) Surface, Wang, L., et al., Appl. Phys. Lett. 63 (10), Sep. 6, 1993 pp. 1336–1338.

Oriented Nucleation of Diamond Films on Nickel Substrates, Yang, P., Zhu, W. Glass. J.T., 1046b Extended Abstracts, Spring Meeting, May 16–21, (1993), Honolulu 93/1 (1993) Pennington, NJ, US pp. 677–678.

Belton, et al. "Nucleation of Chemically Vapor Deposited Diamond on Platinum and Nickel Substances" 2194 Thin Solid Films 212 (1992) May 15, No. 1/2 (68–80).

Narayan, et al. "Enhancement of Nucleation and Adhesion of Diamond Films on Copper, Stainless Steel and Silicon Substances," 931 Journal of Applied Physics 71(2) Jan. 15, 1992, pp. 966–971.

*Primary Examiner*—Roy V. King
*Attorney, Agent, or Firm*—Howell & Haferkamp, L.C.

[57] ABSTRACT

There is provided a diamond crystal in which the (111) oriented plane is of the diamond crystal synthesized on a substrate by a chemical vapor deposition method parallel to a substrate surface, and the area of the (111) oriented plane parallel to the substrate surface is 1/24 or less an area of the crystal on the substrate. A source gas is activated on a substrate consisting of a material which is not reactive with carbon. The source gas contains at least carbon and hydrogen in such a manner that the ratio of the number of carbon atoms to the total number of molecules of the source gas is 0.5% or less. Subsequently, a diamond crystal in which the (111) orientation plane is parallel to the substrate surface, and the area of the (111) orientation plane parallel to the substrate surface is precipitated on the substrate. A copper plate is preferably contains used as the substrate. The source gas preferably contains at least methane gas and hydrogen gas, and the concentration of methane gas is preferably set to be 0.5% or less.

8 Claims, 9 Drawing Sheets

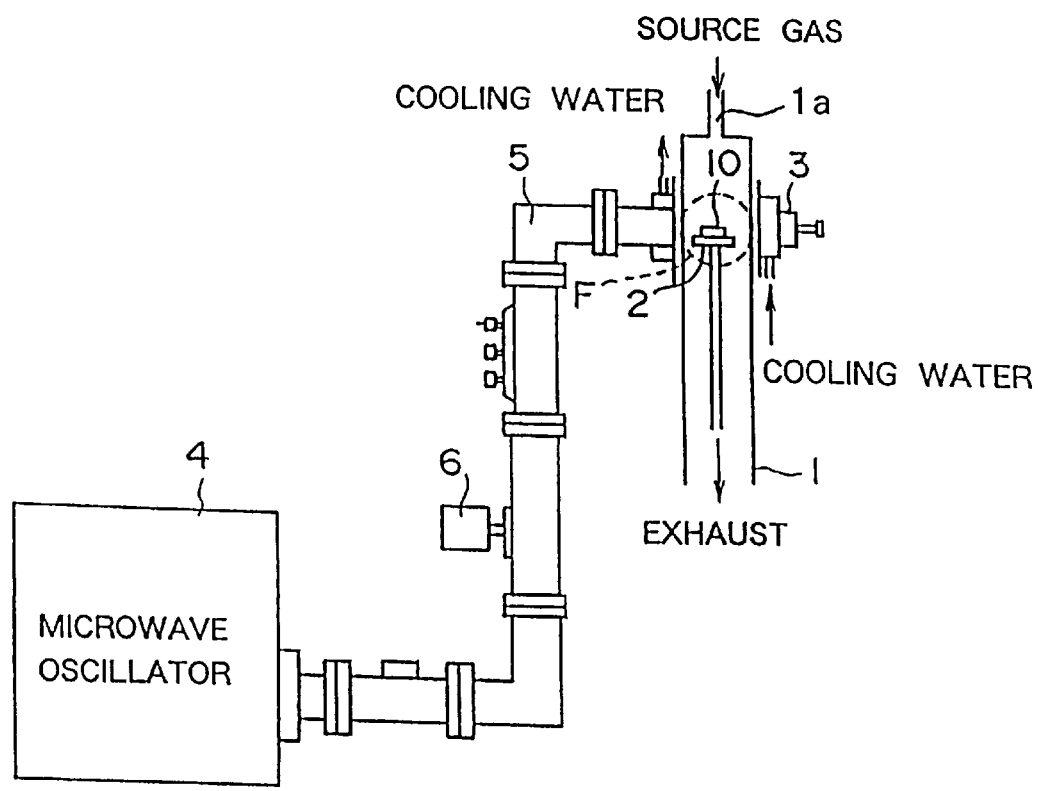
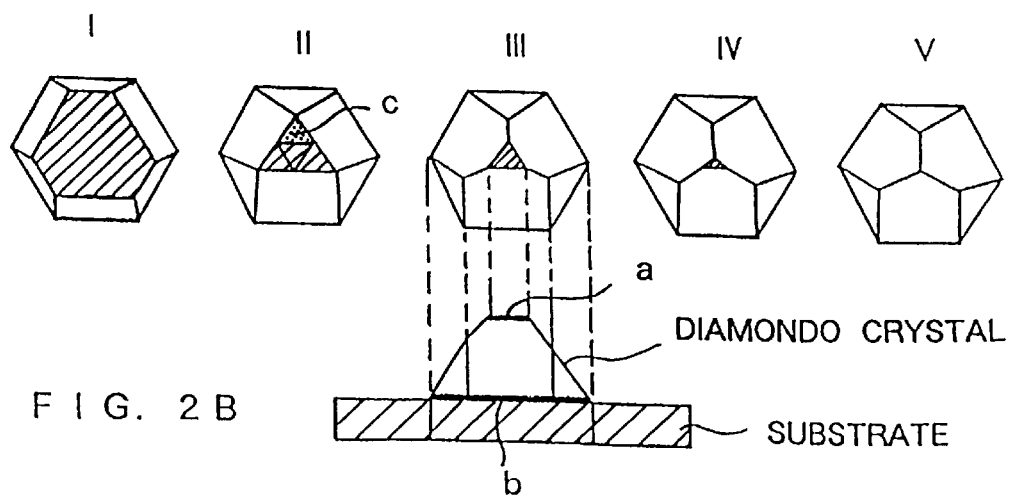

FIG. 3A
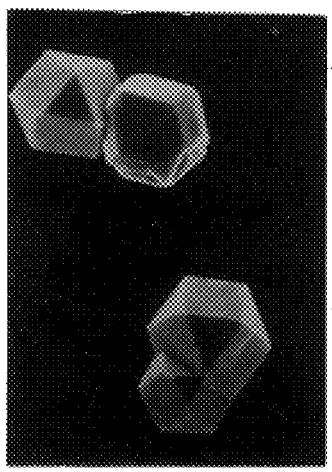
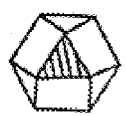
a/b = 1/6
CH₄ = 1.0%
|—20 μm—|
FIG. 3B
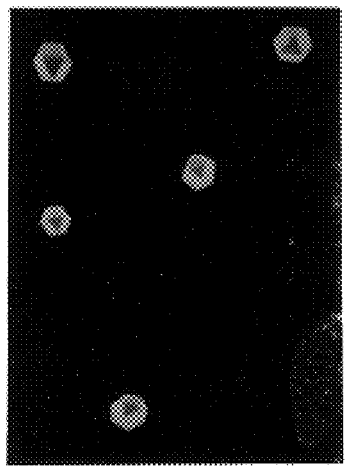
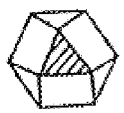
a/b = 1/6
CH₄ = 0.8%
|—20 μm—|
FIG. 3C
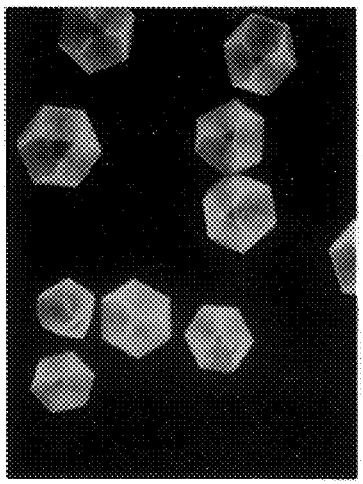
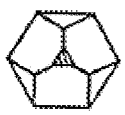
a/b < 1/24
CH₄ = 0.5%
|—20 μm—|
FIG. 3D
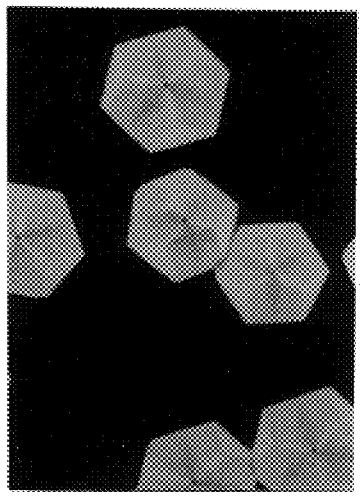
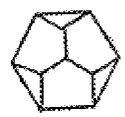
a/b = 1/100
CH₄ = 0.4%
|—10 μm—|
FIG. 3E
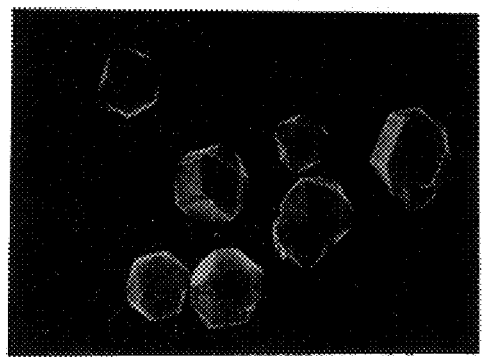
|—10 μm—|
NO ORIENTATION
a/b ≈ 1/6
CH₄ = 0.4%
SILICON SUBSTRATE (100)

FIG. 6A
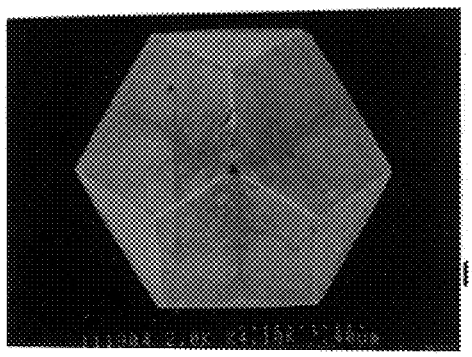 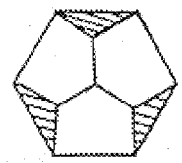
INCLINATION ANGLE OF 0°
FIG. 6B
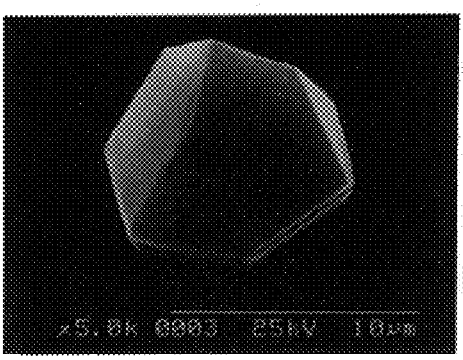 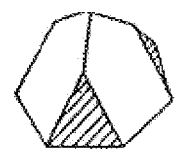
INCLINATION ANGLE OF 50°
FIG. 6C
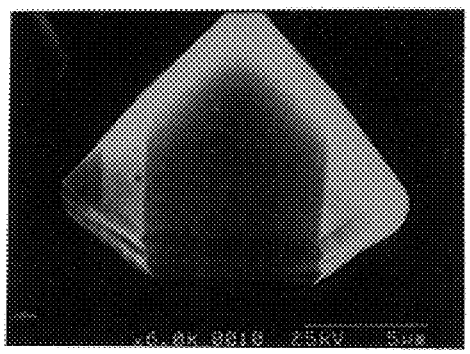 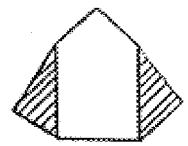
INCLINATION ANGLE OF 80°
FIG. 6D
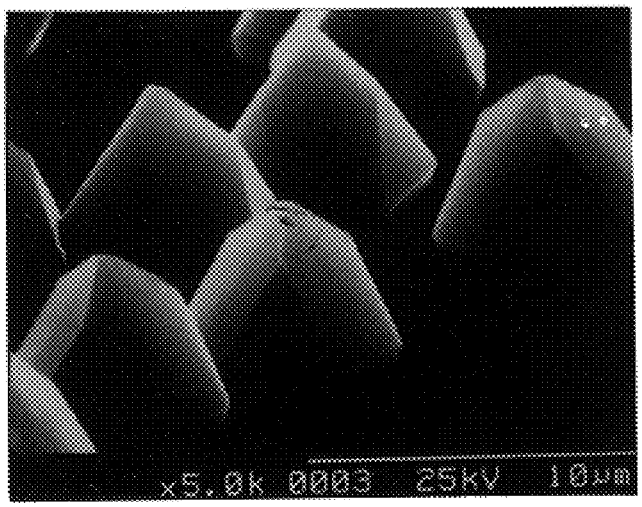

15 MINUTES

30 MINUTES

40 MINUTES

├──┤
200nm

50 MINUTES

15 MINUTES

30 MINUTES

40 MINUTES

50 MINUTES

200nm

NUCLEATION

ORIENTATION

6,060,118

CVD METHOD OF MANUFACTURING DIAMOND CRYSTAL

This is a divisional of application Ser. No. 08/410,218 filed on Mar. 24, 1995 now U.S. Pat. No. 5,792,556.

BACKGROUND OF THE INVENTION

1. Field of The Invention

The present invention relates to a diamond crystal exhibiting excellent characteristics for electronic materials, a tool, hardness measurement, and the like, and a method of manufacturing the same.

2. Description of The Prior Art

Diamond has unique physical properties, e.g., a very high thermal conductivity, a high hardness, a high wear resistance, and a very high refractive index, a very high reflectance, and electrical conductivity. For this reason, diamond is used for a hardness meter, tools, abrasive materials, electronic materials, and the like as well as for ornament. Recently, application of the diamond to semiconductor materials has been considered.

As one of the excellent electrical characteristics of the diamond, a stable negative electron affinity is known. That is, the diamond tends to emit electrons from its surface. A great deal of attention has been paid to a cold cathode as one of electronic parts to which the above characteristic is applied (NIKKEI SCIENCE, December Issue, 1992, pp. 129–130). As another application of this characteristic, the use of a diamond crystal as a probe of an apparatus such as an AFM (Atomic Force Microscope) or STM (Scanning Tunnel Microscope) which is designed to analyze the atomic structure of a surface of a substance has been considered.

In diamond, the concentration of atoms and the atomic arrangement vary depending on different crystal planes, and hence the physical properties also differ. It is known that the (111) plane has a negative electron affinity, which is advantageous for the above applications. It is also known that emission of a larger number of electrons occurs at a sharp portion than at a flat portion because an electric field more easily concentrates on the sharp portion.

Chemical vapor deposition methods (CVD methods) of synthesizing a diamond from a vapor phase at a low pressure have been recently studied and developed, and CVD methods of various schemes have been tried. In consideration of the above applications, it is necessary to arbitrarily control the crystal orientation and shape of diamond synthesized by a CVD method.

A few techniques of controlling the crystal direction of diamond synthesized by a CVD method are known. One of the techniques is called an epitaxial growth method. According to this method, as a substrate for precipitation of a diamond, a diamond substrate or a substrate consisting of limited materials (e.g., silicon carbide, silicon, cubic boron nitride, or nickel) is used. With the use of such a substrate, a diamond can be oriented in the same direction as the crystal direction of the substrate ("Surface Science", Mar. 10, 1994, Vol. 15-2, pp. 91–95). Another method is disclosed in Japanese Unexamined Patent Publication No.2-160695. In this method, a source gas containing an organic compound is activated on a monocrystalline copper substrate to precipitate a diamond as a hexahedral to octahedral single crystal whose (111) plane is grown to be parallel to the substrate.

By using these methods, diamonds oriented on the (111) plane can be synthesized. However, in order to form the diamond into a shape suitable for a cold cathode or an analyzer for the atomic structure of a substance surface as applications, the resultant diamond crystal must be partially sharpened to cause an electric field to concentrate thereon.

For example, the following methods, although they are not designed for diamond, are known as methods of manufacturing a sharp emitter on a portion of a field emission type cold cathode as a type of cold cathode manufactured by using monocrystalline silicon: (1) a method using vacuum deposition; (2) a method using anisotropic etching; (3) a method using a film deposition shape; and (4) an ion milling method ("Electronic Industry Monthly Report", December, 1990, Vol. 32-12, pp. 23 to 25). Methods (1) to (3) of these methods are designed to form an emitter on a silicon substrate by vapor deposition and hence cannot be applied to a diamond sharpening process. Method (2) poses difficulty in anisotropic etching of diamond and can be applied only to a single crystal. Since it is impossible, at present, to synthesize a diamond single crystal having a large area, this method cannot be used. Method (4) is a method of isotopically processing a crystal by irradiating an ion beam regardless of the crystal direction. It is, however, difficult to sharpen diamond by using ions, and it takes much time for such a process. In addition, delicate energy control is required for an ion beam. Therefore, it is difficult to put this method into practical use.

SUMMARY OF THE INVENTION

The present invention has been made in consideration of the above points, and has as its first object to provide a diamond crystal having a very small (111) oriented plane parallel to a substrate and hence requiring no sharpening process.

It is a second object of the present invention to provide a method of manufacturing the diamond crystal provided according to the first object.

In order to achieve the first object, according to the present invention, a (111) oriented plane of a diamond crystal synthesized on a substrate by a chemical vapor deposition method is parallel to a substrate surface, and an area of the (111) oriented plane parallel to the substrate surface is not more than $1/24$ an area of the crystal on the substrate.

In order to achieve the second object, according to the present invention, there is provided a method of manufacturing a diamond crystal, comprising the steps of activating a source gas on a substrate consisting of a material which does not combine with carbon, the source gas containing at least a carbon compound and hydrogen gas in such a manner that a ratio of the number of carbon atoms to the total number of molecules of the source gas is not more than 0,5%, and precipitating, on the substrate, a diamond crystal having a (111) oriented plane parallel to a substrate surface, and the (111) oriented plane parallel to the substrate surface having an area not more than $1/24$ an area of the crystal on the substrate.

In the manufacturing method according to the present invention, the source gas may contain one or a plurality of types of carbon compounds. A copper plate is preferably used as the substrate. A source gas preferably contains oxygen such that the ratio of the number of oxygen atoms to that of carbon atoms is 1:1 or less.

According to the above arrangement of the present invention, a source gas containing at least a carbon compound and hydrogen and a substrate consisting of a material, such as copper, which is not reactive with carbon are used, and the ratio of the number of carbon atoms to the total number of molecules of the source gas is set to be about 0,5% or less. By setting such conditions, a diamond crystal can be obtained as follows. In the early stage of the crystal growth process, the crystal has a flat shape. As the crystal grows, the (111) plane parallel to the substrate surface is sharpened to such an extent that the area of the (111) plane is reduced to 1/24 or less the area of the crystal on the substrate. As described above, the (111) plane of the diamond crystal is parallel to the substrate surface, and the area of the (111) plane is 1/24 or less the area of the crystal on the substrate. Therefore, no sharpening process is required.

BRIEF DESCRIPTION OF THE DRAWINGS

FIG. 1 illustrate the schematic arrangement of a microwave plasma CVD apparatus for manufacturing a diamond according to the present invention;

FIG. 2A illustrates the (111) oriented plane of a diamond crystal, and FIG. 2B explains definition of the sharpness of the diamond crystal in the present invention;

FIGS. 3A, 3B, 3C, 3D and 3E are micrographs showing the morphologies of diamond crystals manufactured under different synthesis conditions according to the present invention;

FIGS. 6A, 6B, 6C and 6D are micrographs of morphologies viewed obliquely downward to illustrate the sharpened states of diamond crystals according to the present invention;

DETAILED DESCRIPTION OF PREFERRED EMBODIMENT

Figure 4A:
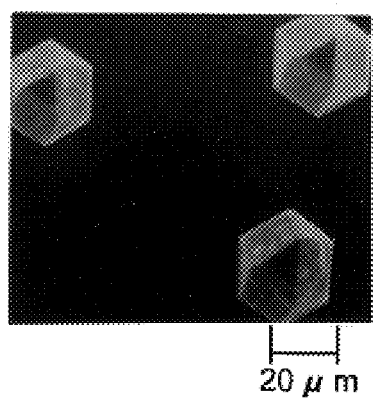
FIGS. 4A, 4B, 4C, 4D, 4E, 4F and 4G are micrographs showing the morphologies of diamond crystals manufactured under different synthesis conditions according to the present invention.
Figure 4B:
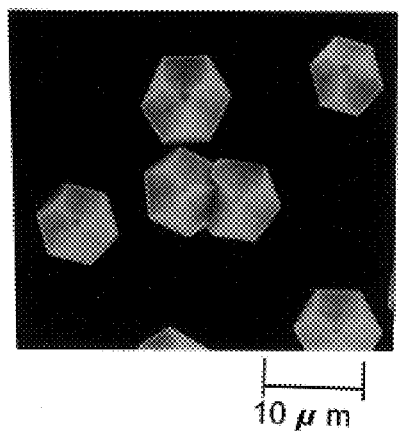

An embodiment of the present invention will be described in detail below.

The following embodiment is associated with diamond synthesis by a microwave plasma CVD method. FIG. 1 shows a microwave plasma CVD apparatus as a diamond synthesis apparatus.

This apparatus has the same structure as that of a conventional apparatus. Reference numeral 1 denotes a quartz reaction vessel for synthesizing diamonds; 2, a substrate support base arranged in the reaction vessel 1; 3, a reflecting plate for reflecting microwaves; 4, a microwave oscillator as an excitation source; and 5, a waveguide tube for guiding microwaves generated by the microwave oscillator 4 to a reaction field F (indicated by the broken circle) in the reaction vessel 1. The waveguide tube 5 has a power monitor 6 for monitoring power supplied to the microwave oscillator 4.

Diamond is synthesized by the above apparatus in the following manner. First of all, a high vacuum is produced in the reaction vessel 1. A gas mixture containing a hydrocarbon gas such as methane, ethane, propane, butane, ethylene, or benzene, oxygen, and hydrogen at a predetermined ratio is supplied, as a source gas, into the reaction vessel 1 via a gas inlet 1a. The microwave oscillator 4 is then energized, and the resulting microwaves are guided to the reaction field F in the reaction vessel 1 via the waveguide tube 5 to produce a plasma. The pressure in the reaction vessel 1 is maintained at 40 Torr by changing a gas mixture. Thereafter, the substrate support base 2 on which a copper plate as a substrate 10 for precipitation of diamond is placed is inserted in the plasma formed in the reaction field F in the reaction vessel 1. At this time, the temperature of the copper plate as the substrate 10 is set to be about 650° C. to 840° C., and a peripheral portion of the reaction field F in the reaction vessel 1 is cooled by cooling water. After the lapse of about 50 minutes, a diamond crystal is grown on the substrate 10. This diamond crystal is oriented on the (111) plane, and the orientation plane has an area 1/24 or less the area of the diamond surface on the substrate 10.

Experiments on synthesis of diamond which were conducted by the inventors will be described next.

The experiments were conducted by using the microwave plasma CVD apparatus shown in FIG. 1. The oscillation frequency of the microwave oscillator 4 was 2,450 MHz, and the output was 500 W to 600 W. As a source gas for synthesis of diamond, a gas mixture of methane gas, oxygen, and hydrogen, or a gas mixture of methane gas and hydrogen, which contains no oxygen, was used. Total supply amount of source gas was maintained at 100 ccm ($cm^3$/min), but the supply amounts of methane and oxygen or the supply amount of methane was changed. As the substrate 10 for precipitation of diamond, a monocrystalline or polycrystalline copper plate was used. For comparison with the copper plate as the substrate 10, the (100) plane of monocrystalline silicon was also used. The temperature of the substrate 10 was set to be 650° C. to 840° C.

The results of the experiments are shown in the following table.

In each of Experiment Nos. 1 to 4 and 13, a polycrystalline copper plate was used as the substrate 10. In each of Experiment Nos. 6 to 12, a monocrystalline copper plate was used as the substrate 10. In the following table, a polycrystalline copper plate is referred to as "copper (poly)", and a monocrystalline copper plate is referred to together with a crystal plane on which diamond is to be precipitated (e.g., "copper (100)"). In the table, the supply amounts (ccm) of methane and oxygen are shown. The table also shows a ratio (methane concentration) CNR of the number of carbon atoms in a source gas, and the ratio (C:O) of the number of carbon atoms to that of oxygen atoms. Note that the ratio CNR of the number of carbon atoms is given by the following equation:

Ratio CNR (%) of number of carbon atoms = (supply amount of carbon compound) × (number of carbon atoms per molecule of carbon compound)/(supply amount of source gas) = (number of molecules of carbon compound) × (number of carbon atoms per molecule of carbon compound)/(total number of molecules of source gas) = (number of carbon atoms)/(total number of molecules of source gas)     . . . (1)

A ratio a/b represents the sharpness of a crystal, where a is the area of the (111) oriented plane of a diamond crystal precipitated on the substrate 10, and b is the area of the diamond crystal on the substrate 10 (see FIG. 2B).

| Experiment No. | Supply Amount of Methane (ccm) | Supply Amount of Oxygen (ccm) | CNR (%) | C:O Ratio of Number of Atoms | Substrate | (111) Orientation | Sharpness | Substrate Temperature (° C.) | Sharpness a/b |
|---|---|---|---|---|---|---|---|---|---|
| 1 | 1.0 | 0.5 | 1.0 | 1:1 | copper (poly) | yes | no | 674–734 | 1/6 |
| 2 | 0.8 | 0.4 | 0.8 | 1:1 | copper (poly) | yes | no | 663–668 | 1/6 |
| 3 | 0.5 | 0.25 | 0.5 | 1:1 | copper (poly) | yes | slight | 653–667 | 1/24 or less |
| 4 | 0.4 | 0.2 | 0.4 | 1:1 | copper (poly) | yes | yes | 670–700 | 1/100 or less |
| 5 | 0.4 | 0.2 | 0.4 | 1:1 | silicon | no | no | 830 | 1/6 |
| 6 | 1.0 | 0.5 | 1.0 | 1:1 | copper (100) | yes | no | — | 1/6 |
| 7 | 0.4 | 0.2 | 0.4 | 1:1 | copper (100) | yes | yes | 670–700 | 1/100 or less |
| 8 | 1.0 | 0.5 | 1.0 | 1:1 | copper (110) | yes | no | 720 | 1/6 |
| 9 | 0.4 | 0.2 | 0.4 | 1:1 | copper (110) | yes | yes | 725 | 1/100 or less |
| 10 | 1.0 | 0.5 | 1.0 | 1:1 | copper (111) | yes | no | — | 1/6 |
| 11 | 0.4 | 0.2 | 0.4 | 1:1 | copper (111) | yes | yes | 674–710 | 1/100 or less |
| 12 | 0.4 | 0.0 | 0.4 | — | copper (100) | yes | slight | — | 1/24 |
| 13 | 0.4 | 0.2 | 0.4 | 1:1 | copper (poly) | yes | slight | 747–843 | 1/24 |

Before examination of the results of the experiments, sharpening of a diamond crystal will be described below.

FIG. 2A shows the (111) oriented planes of diamond crystals by hatching. The (111) oriented plane becomes sharper in the order of "I", "II", "III", . . . . With regards to the crystal indicated by "III" in FIG. 2A, as shown in FIG. 2B, the degree of sharpening, i.e., the sharpness of the (111) oriented plane, is represented by a value a/b where a is the area of the (111) oriented plane, and b is the bottom area of the crystal on the substrate. For example, the sharpness a/b of the crystal indicated by "II" in FIG. 2A is ⅙. In this case, the sharpness a/b of a diamond crystal having a portion c (indicated by halftone dots), as the (111) oriented plane, which is obtained by dividing the (111) oriented plane (hatched triangle) of the crystal indicated by "II" in FIG. 2A into four equal parts is 1/24. A diamond with such sharpness can be used in a variety of applications. Therefore, in the present invention, the presence of "sharpness" is determined as a sharpness a/b of 1/24 or less.

The results of Experiment Nos. 1 to 4 each using the polycrystalline copper plate will now be examined.

FIG. 2A illustrates the (111) oriented planes of diamond crystals obtained by the experiments. These (111) oriented planes are indicated by hatching. FIGS. 3A to 3E are micrographs of these morphologies. In these micrographs, each dark rectangular portion is the (111) oriented plane parallel to the substrate 10. Consider the (111) oriented planes. While the methane concentration remains between 1.0% (FIG. 3A) and 0.8% (FIG. 3B), the ratio a/b of the area a of the (111) oriented plane to the bottom surface area b is ⅙. That is, no significant sharpness is recognized. When the methane concentration becomes 0.5% or less (FIG. 3C), the size of the (111) oriented plane corresponds to a/b=1/24 or less. That is, a large increase in sharpness is recognized. When the methane concentration further decreases to 0.4% (FIG. 3D), the size of the (111) oriented plane corresponds to a/b 1/100 or less. That is, an extreme increase in sharpness is recognized. Note that the diamond synthesized by the present invention reduces only in the area of the (111) oriented plane parallel to the substrate 10, which contributes to an increase in the sharpness of the diamond crystal.

In Experiment No. 5, a monocrystalline silicon substrate was used as the substrate 10. In this case, although both the methane concentration and the oxygen concentration are low, the number of (111) oriented diamond crystals is small, and no significant sharpness is recognized.

The results of Experiment Nos. 6 to 12, each using a monocrystalline copper plate as a substrate will be discussed.

In Experiment Nos. 7, 9 and 11, when the methane concentration was 0.4% or less, the ratio a/b became 1/24 or less, and sufficient sharpness was recognized as in the case wherein the polycrystalline copper plates were used. Even when no oxygen was used as in Experiment No. 12, the ratio a/b became 1/24, and hence sharpness was recognized.

FIGS. 4A to 4G are micrographs showing the morphologies of diamond crystals corresponding to Experiment Nos. 6 to 12.

Figure 4C:
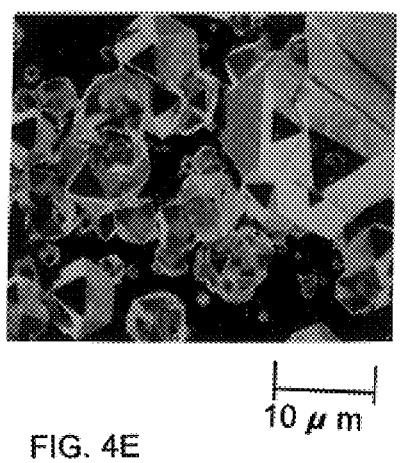
Figure 4D:
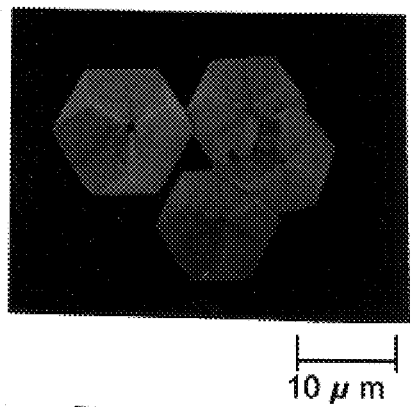
Figure 4E:
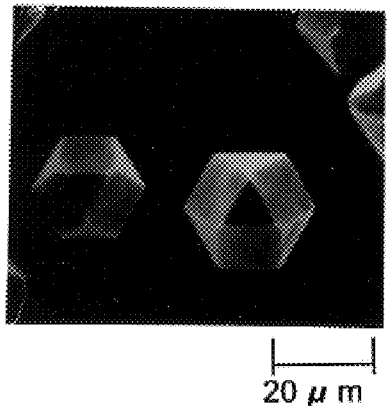
Figure 4F:
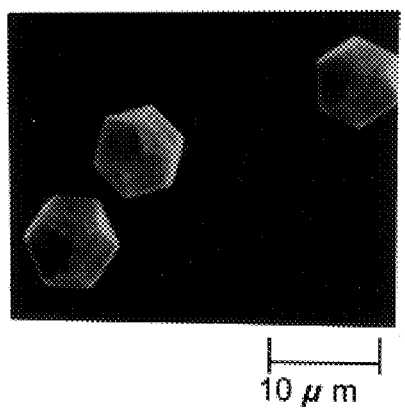
Figure 4G:
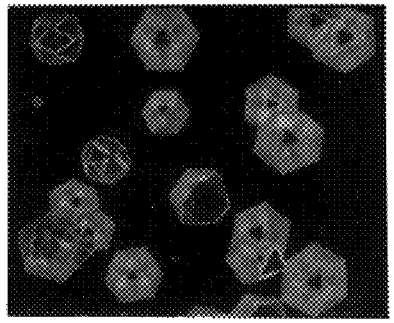

FIGS. 4A, 4C, and 4E show the morphologies obtained with the methane concentration of 1.0%. These morphologies respectively correspond to Experiment Nos. 6, 8, and 10. Although these diamond crystals are (111) oriented, no sharpness is recognized. In contrast to this, the morphologies shown in FIGS. 4B, 4D, and 4F correspond to Experiment Nos. 7, 9, and 11, and sharpness is recognized together with (111) oriented.

Experiment No. 13 in which a diamond was synthesized with a higher temperature of a copper plate as a substrate will now be explained.

Resulting sharpness of a/b=1/24 which is inferior to that (a/b<1/100) obtained in Experiment No. 4 with a lower temperature of the substrate was recognized.

Figure 5A:
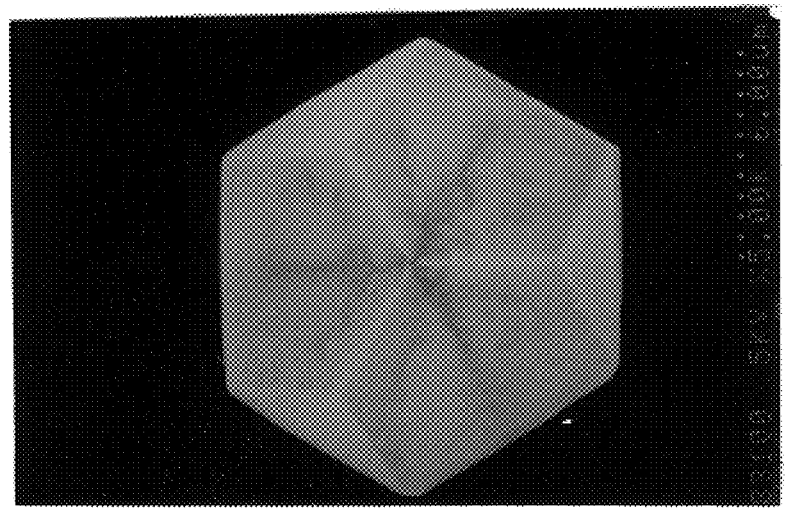
FIGS. 5A, 5B and 5C are micrographs showing planar morphologies to illustrate the sharpened states of diamond crystals according to the present invention.
Figure 5B:
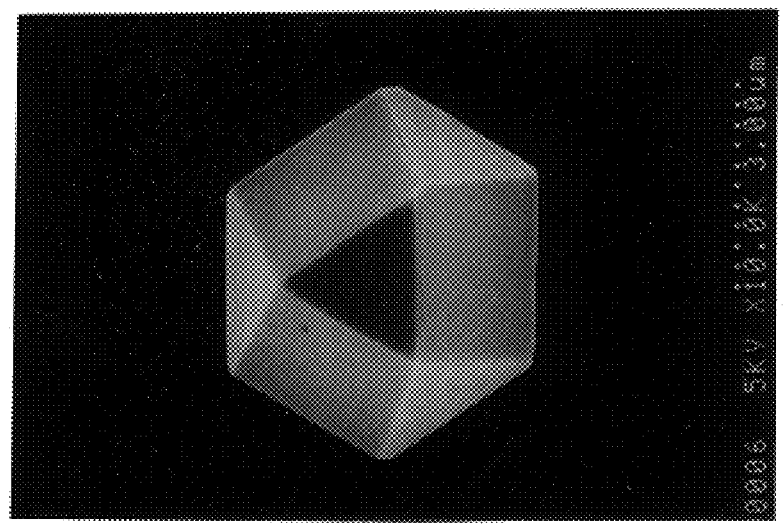
Figure 5C:
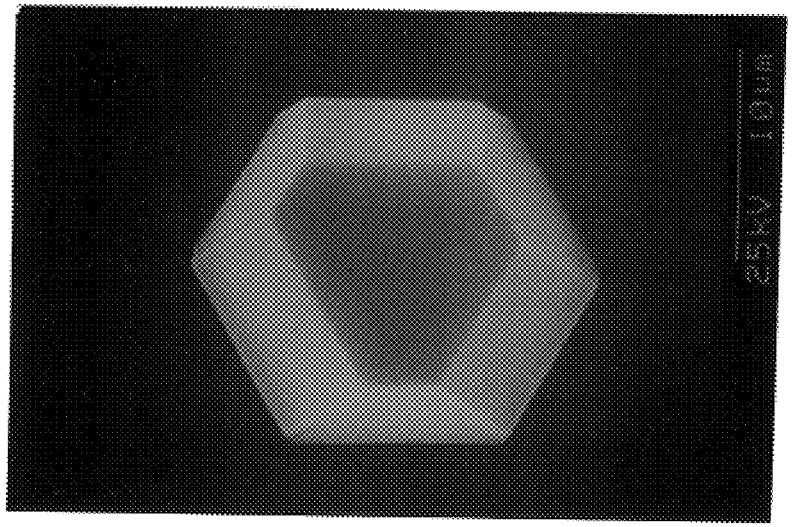

Referring to FIGS. 3A to 3E and 4A to 4G, each micrograph shows a plurality of diamond grains in a relatively small size. For this reason, the (111) oriented planes of interest may not be clearly seen. FIGS. 5A to 5C, therefore, show enlarged views of three diamond grains with (111) planes having different sizes. FIG. 5A shows the grain with a/b<about 1/100; FIG. 5B, the grain with a/b=about ⅙; and FIG. 5C, the grain with a/b=about ⅓. FIGS. 6A to 6D are micrographs showing the sharpness of a diamond grain. FIG. 6A shows the diamond crystal having sharpness corresponding to a/b<about 1/100, viewed from right above, i.e., the (111) direction. FIG. 6B shows the same crystal inclined at 50°. FIG. 6C shows the same crystal inclined at 80°. FIG. 6D shows a plurality of crystals identical to the above crystal inclined at 75°. FIGS. 6A to 6D clearly show the sharpened shape of the diamond crystal.

In the present invention, diamond grains are isolated from each other to such an extent that the shape of each grain can be easily observed. In general, new nucleation called secondary nucleation tends to occur on the polycrystalline continuous film of diamond. For this reason, it is difficult to control the orientation characteristics and shapes of grains. In contrast to this, it is known that isolated grains are superior in crystallinity to a continuous film because the isolated grains have no grain boundary. Therefore, good material characteristics can be expected.

It is, therefore, necessary to control the synthesis time corresponding to a nucleation density to keep the state of isolated grains. If, for example, the nucleation density of diamond is to be controlled to $1\times10^4$ nuclei/mm$^2$, the synthesis time must be controlled to keep the state of isolated grains, and the diameters of diamond crystal grains must be restricted to at least 10 μm or less due to the following reason. Apparently from calculations, when the average grain diameter of grains exceeds 10 μm, the grains cover the substrate almost entirely to form a continuous film.

According to experiments conducted by the inventors, when the supply amount of methane is 0.5 ccm, the growth rate of a diamond grain is about 0.5 μm/hour. Therefore, if the diamond nucleation density is $1\times10^4$ nuclei/mm$^2$, the synthesis time must be shorter than about 20 hours.

Figure 7A:
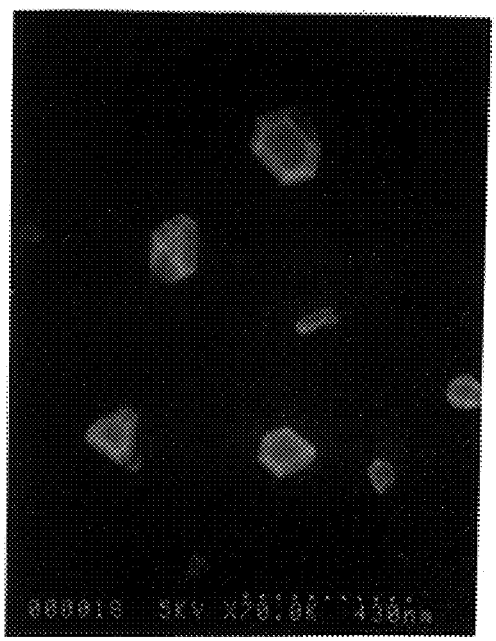
FIGS. 7A, 7B, 7C and 7D are micrographs of morphologies, showing the growth process of diamond crystal grains manufactured by the present invention.
Figure 7B:
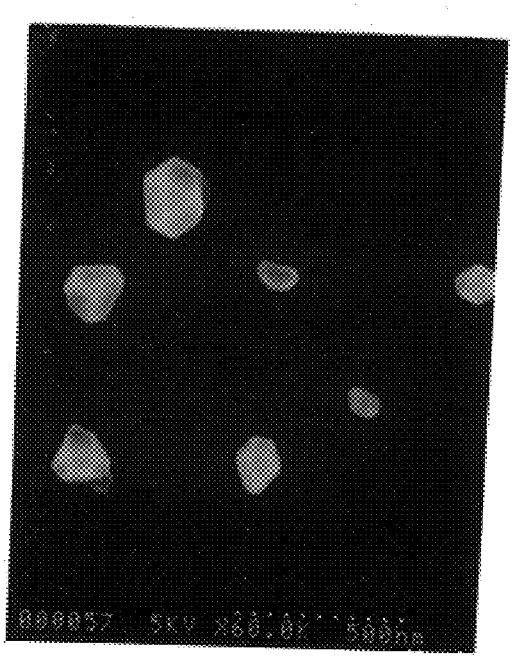
Figure 7C:
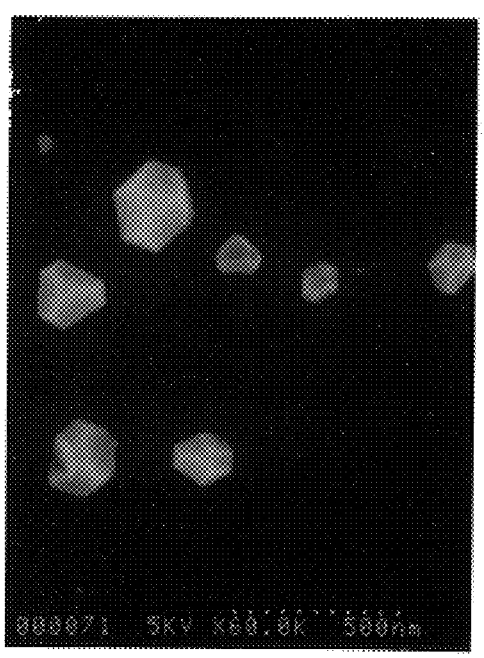

FIGS. 7A to 7D are micrographs showing the movement of diamond crystal grains on the same region on a copper plate as a substrate with the lapse of time. FIG. 7A shows the state of the diamond crystal grains after the lapse of 15 minutes; 7B, the state after the lapse of 30 minutes;

FIG. 7C, the state after the lapse of 40 minutes; and

Figure 7D:
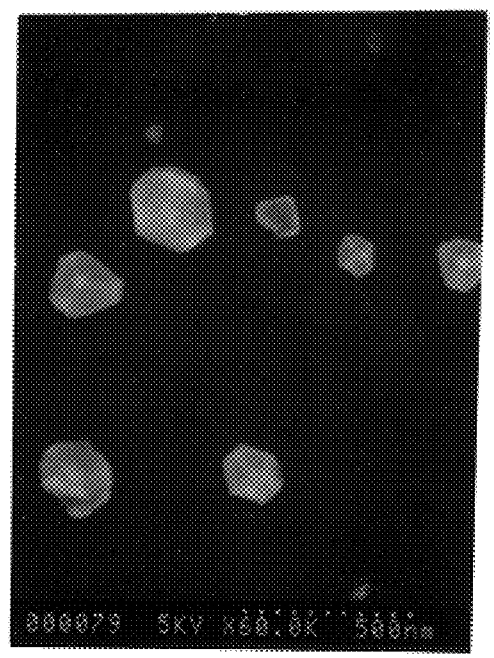

FIG. 7D, the state after the lapse of 50 minutes.

Consider the crystal grain indicated by the white arrow in each micrograph. The position of this crystal grain is greatly changed between the state shown in FIG. 7A after the lapse of 15 minutes and the state shown in FIG. 7B after the lapse of 30 minutes. It is also known from the positional relationship between this particular crystal grain and the other crystal grains that the crystal grain has further moved greatly in the state shown in FIG. 7C after the lapse of 40 minutes. This phenomenon of movement is conspicuous especially in the early stage of the growth process of a crystal grain.

FIGS. 8A to 8E are micrographs showing the growth process of diamond crystal grains.

Consider the crystal grain indicated by the white arrow in each micrograph. In the state shown in FIG. 8A, the crystal grain is still flat (corresponding to stage 1 or 2 in FIG. 8E). In the state shown in FIG. 8B, the crystal grain is grown to the extent corresponding to a/b=⅙ (corresponding to stage 4 in FIG. 8E). In the state shown in FIG. 8C, the ratio a/b becomes about ⅒ or less, and the sharpness increases to some extent (corresponding to stage 5 in FIG. 8E). In the state shown in FIG. 8D, the ratio a/b becomes 1/24 or less, and the sharpness further increases (corresponding stage 6 in FIG. 8E). At this time, the crystal grain diameter is about 200 nm. It is apparent from this that in this embodiment, a diamond crystal grain having a sharpness a/b of 1/24 or less and a grain diameter of about 200 enm is synthesized.

Upon observation of the movement of the diamond crystal grain from the micrographs in FIGS. 8A to 8D, the inventors have estimated the reason why a diamond crystal is (111) oriented on a copper substrate in the early stage of the synthesis process under the synthesis conditions of the present invention. This reason will be described below with reference to FIGS. 9A to 9C.

Figure 9A:
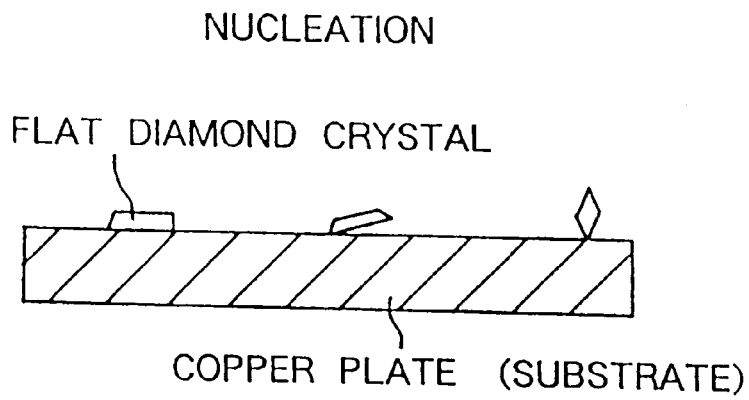
FIGS. 9A, 9B and 9C explain the reason why diamond crystal grains are oriented on the (111) plane.

In the stage shown in FIG. 9A, a diamond nucleus is formed on the copper plate. According to the observation result, in this stage, a diamond crystal grain often has a flat shape corresponding to stage 1 or 2 in FIG. 8E. As is apparent, such a small diamond crystal grain has a flat shape with a large (111) oriented plane.

Figure 9B:
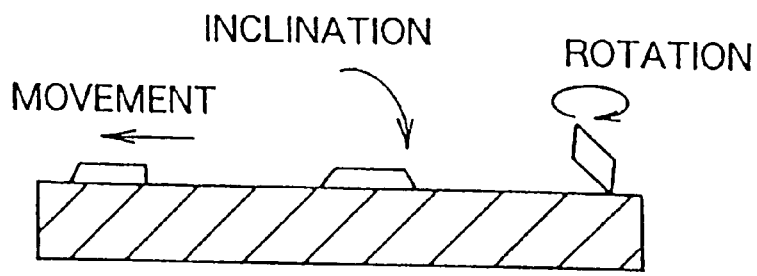

In the stage shown in FIG. 9B, the resultant small diamond crystal moves and rotates on the copper plate. From the observation of such a phenomenon of movement, it is recognized that the flat diamond crystal directs its flat (111) oriented plane in a direction parallel to the copper plate. This phenomenon of movement is conspicuous especially for a crystal having a size of 100 nm or less.

Figure 9C:
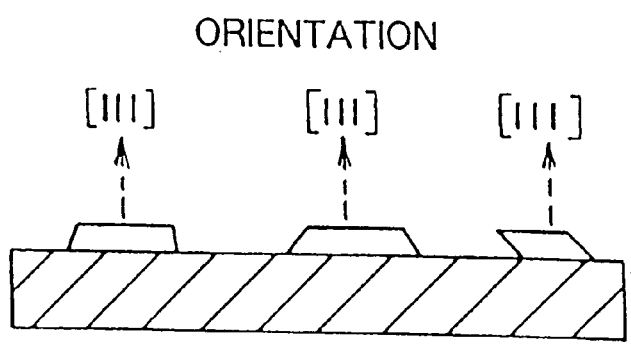

In the stage shown in FIG. 9C, when the diamond crystal grain is grown, and its size exceeds 500 nm, almost no movement of the crystal grain occurs. Diamond crystal grains fixed in certain directions continue to grow. As a result, a large number of (111) oriented diamond crystals can be obtained. The ratio of the (111) oriented crystals is 70 to 80%.

The embodiment of the present invention has been described above. As a source gas for synthesis of diamond, for example, the following gas can be used: a gas mixture of hydrogen gas and hydrocarbon gas such as methane, ethane, propane, butane, hexane, ethylene, benzene, or acetylene; a gas mixture obtained by adding oxygen gas or carbon dioxide to the above gas mixture; a gas mixture of hydrogen gas and an oxygen-containing organic compound such as methanol, ethanol, or acetone; or a gas mixture of carbon monoxide and hydrogen gas. A carbon component as a constituent component of a source gas used for synthesis of diamond in the present invention can be obtained from any type of carbon compound.

A copper plate is used as a substrate in this embodiment. However, a substrate consisting of any material (e.g., platinum, gold, or silver) which is equivalent to a copper plate in behavior during orientation of a diamond crystal, i.e., a material which is not reactive with carbon, can be used in place of the copper plate. In addition, as a substrate for the present invention, not only a single metal plate but also a plate obtained in the following manner may be used. This plate is obtained by forming a thin film consisting of copper, gold, silver, or platinum on a material exhibiting stable characteristics in the environment for synthesis of diamond, such as silicon, silicon oxide, silicon nitride, silicon carbide, sapphire, molybdenum, or tungsten, by vacuum deposition, sputtering, ion beam film formation, a PVD method such as ion plating, a CVD method, or plating.

In this embodiment, diamond crystals are synthesized by a plasma CVD method using a microwave plasma. However, the present invention can also use a DC discharge plasma, a thermal plasma, or an RF thermal plasma, and can use a hot filament CVD method, an electron impact CVD method, an arc jet method, or the like.

As has been described above, according to the present invention, a diamond crystal with a sharp tip, having a (111) oriented plane which is parallel to the substrate surface and has an area 1/24 or less the area of the crystal on the substrate, can be obtained by a CVD method at a low pressure. For this reason, a sharpening process, which has been conventionally considered as difficult, is not required. A diamond crystal obtained by the present invention is oriented on the (111) oriented plane exhibiting a negative electron affinity, and has a sharp tip. Therefore, such a diamond crystal can be used as a small cold cathode electron source or the probe of an atomic structure analyzer to which a great deal of attention has been paid in the field of vacuum microelectronics. In addition, as is apparent, this diamond crystal can also be used as the penetrator of a hardness meter.

What is claimed is:

1. A method of manufacturing a crystalographically-oriented diamond crystal, comprising the steps of:

activating a source gas on a substrate consisting of a material which does not combine with carbon, the source gas containing at least carbon and hydrogen in such a manner that a ratio of the number of carbon atoms to the total number of molecules of the source gas is not more than 0.5%; and precipitating diamond crystals on said substrate having (111) oriented planes parallel to a surface of said substrate, and an area of the (111) oriented planes parallel to said substrate not more than 1/24 of an area of said crystal on said substrate.

2. A method according to claim 1, wherein the source gas contains oxygen in such a manner that a ratio of the number of oxygen atoms to that of carbon atoms contained in the source gas is not more than 1:1.

3. A method according to claim 1, wherein the carbon in the source gas is obtained from methane gas.

4. A method according to claim 1, wherein said substrate is a copper plate.

5. A method according to claim 4, wherein a temperature of said substrate is 670° C. to 725° C.

6. A method according to claim 1, wherein the source gas is activated by a plasma produced by an RF, DC, or microwave excitation source.

7. A method according to claim 1, wherein the source gas is activated by a hot filament.

8. A method according to claim 1, wherein the source gas is activated by arc jets.

\* \* \* \* \*

UNITED STATES PATENT AND TRADEMARK OFFICE
CERTIFICATE OF CORRECTION

PATENT NO. : 6,060,118
DATED : May 9, 2000
INVENTOR(S) : Ishikura et al.

Page 1 of 4

It is certified that error appears in the above-identified patent and that said Letters Patent is hereby corrected as shown below:

In the Drawings,
On drawing sheet 6, Figures 7A and 7B should be replaced with Figures 7A and 7B as shown below. The figures shown below properly include arrows that were inadvertently omitted from the figures disclosed on drawing sheet 6.

FIG. 7A

15 MINUTES

FIG. 7B

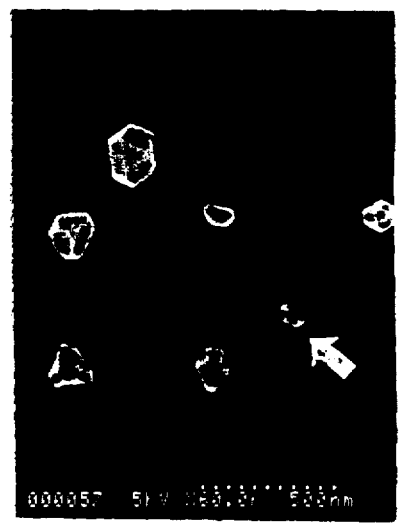

30 MINUTES

UNITED STATES PATENT AND TRADEMARK OFFICE
CERTIFICATE OF CORRECTION

PATENT NO.    : 6,060,118
DATED         : May 9, 2000
INVENTOR(S)   : Ishikura et al.

It is certified that error appears in the above-identified patent and that said Letters Patent is hereby corrected as shown below:

On drawing sheet 6, Figures 7C and 7D should be replaced with Figures 7C and 7D as shown below. The figures shown below properly include arrows that were inadvertently omitted from the figures disclosed on drawing sheet 6.

FIG. 7C

40 MINUTES

FIG. 7D

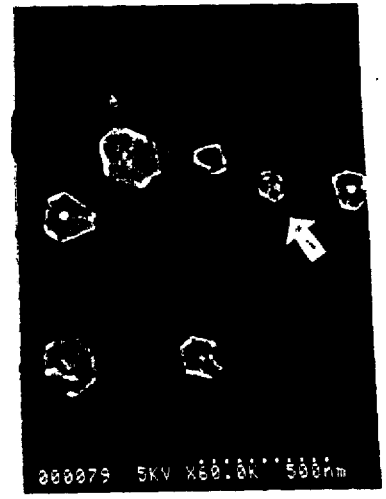

200nm

50 MINUTES

UNITED STATES PATENT AND TRADEMARK OFFICE
CERTIFICATE OF CORRECTION

PATENT NO. : 6,060,118
DATED : May 9, 2000
INVENTOR(S) : Ishikura et al.

Figure 8A:
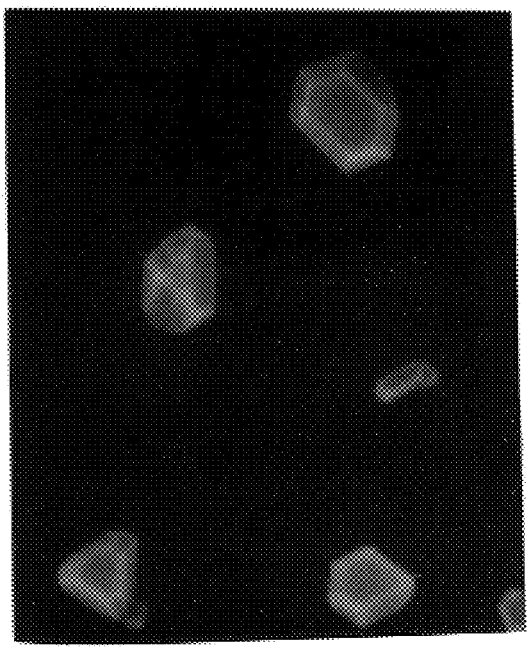
FIGS. 8A, 8B, 8C and 8D are micrographs of morphologies, showing the movement of diamond crystal grains, which are manufactured by the present invention, with the lapse of time.
Figure 8B:
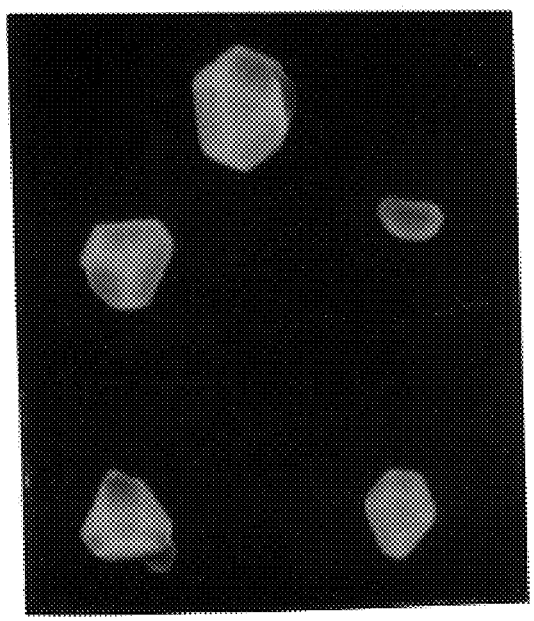

It is certified that error appears in the above-identified patent and that said Letters Patent is hereby corrected as shown below:

On drawing sheet 7, Figures 8A and 8B should be replaced with Figures 8A and 8B as shown below. The figures shown below properly include arrows that were inadvertently omitted from the figures disclosed on drawing sheet 7.

FIG. 8A

15 MINUTES

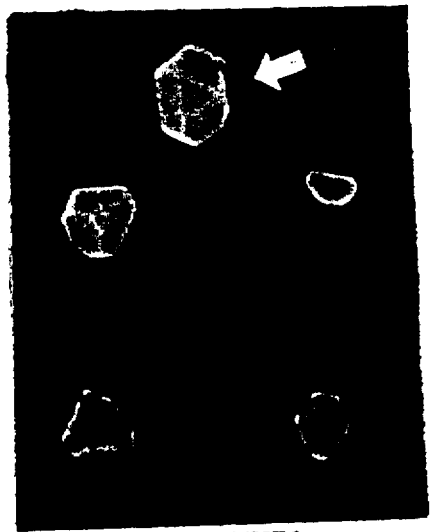

FIG. 8B

30 MINUTES

UNITED STATES PATENT AND TRADEMARK OFFICE
CERTIFICATE OF CORRECTION

PATENT NO.    : 6,060,118
DATED         : May 9, 2000
INVENTOR(S)   : Ishikura et al.

Figure 8C:
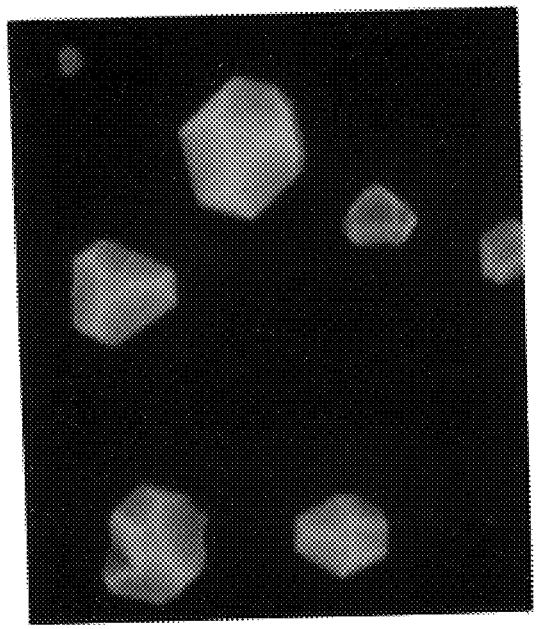
Figure 8D:
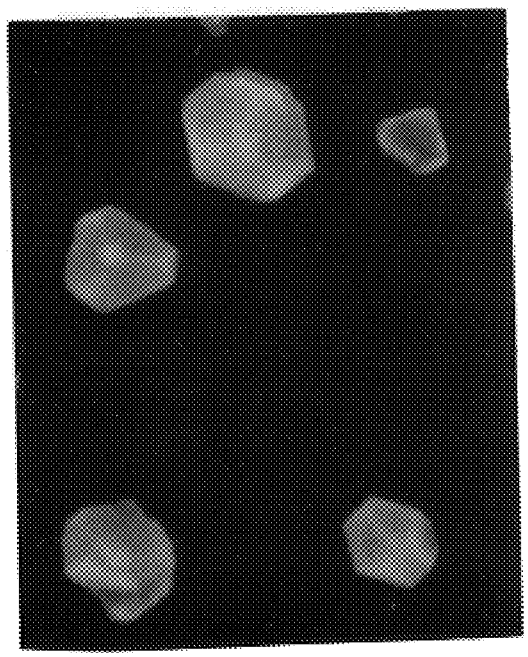
Figure 8E:
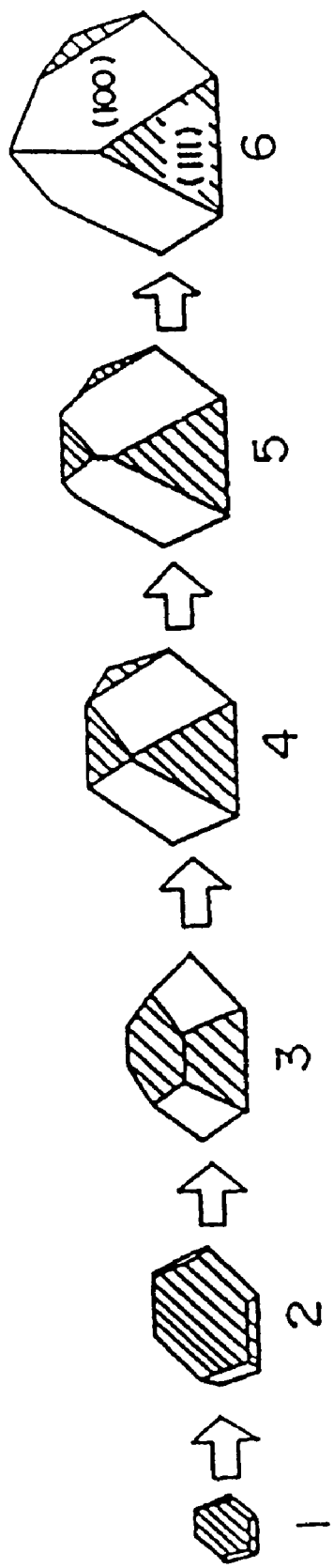
FIG. 8E illustrates the growth process of a diamond crystal grain.

It is certified that error appears in the above-identified patent and that said Letters Patent is hereby corrected as shown below:

On drawing sheet 7, Figures 8C and 8D should be replaced with Figures 8C and 8D as shown below. The figures shown below properly include arrows that were inadvertently omitted from the figures disclosed on drawing sheet 7.

FIG. 8C

40 MINUTES

FIG. 8D

50 MINUTES  
200nm

Signed and Sealed this

Thirteenth Day of November, 2001

Attest:

*Attesting Officer*

NICHOLAS P. GODICI
*Acting Director of the United States Patent and Trademark Office*